United States Patent
Wang et al.

(10) Patent No.: US 12,099,150 B2
(45) Date of Patent: Sep. 24, 2024

(54) MULTI-TRANSDUCER CHIP ULTRASOUND DEVICE

(71) Applicant: Exo Imaging, Inc., Redwood City, CA (US)

(72) Inventors: Liang Wang, Newark, CA (US); Yusuf Haque, Woodside, CA (US); Janusz Bryzek, Oakland, CA (US)

(73) Assignee: Exo Imaging, Inc., Santa Clara, CA (US)

( * ) Notice: Subject to any disclaimer, the term of this patent is extended or adjusted under 35 U.S.C. 154(b) by 303 days.

(21) Appl. No.: 17/511,245

(22) Filed: Oct. 26, 2021

(65) Prior Publication Data

US 2023/0125688 A1 Apr. 27, 2023

(51) Int. Cl.
*B06B 1/00* (2006.01)
*B81B 7/00* (2006.01)
(Continued)

(52) U.S. Cl.
CPC .......... *G01S 7/52079* (2013.01); *B81B 7/008* (2013.01); *G01S 7/5205* (2013.01); *G01S 15/8925* (2013.01); *B81B 2201/0271* (2013.01)

(58) Field of Classification Search
CPC ............. B06B 1/00; B81B 7/00; B81B 7/008; B81B 2201/0271; G01S 7/52; G01S 7/5025;
(Continued)

(56) References Cited

U.S. PATENT DOCUMENTS

| | | |
|---|---|---|
| 3,525,071 A | 8/1970 | Massa |
| 4,511,052 A | 4/1985 | Klein et al. |

(Continued)

FOREIGN PATENT DOCUMENTS

| | | |
|---|---|---|
| CN | 106536067 A | 3/2017 |
| CN | 107768335 A | 3/2018 |
| CN | 111001553 A | 4/2020 |
| JP | 2004130138 A | 4/2004 |
| JP | 2006094459 A | 4/2006 |

(Continued)

OTHER PUBLICATIONS

Mahn et al. Au-Sn solid-liquid interdiffusion (SLID) bonding for piezoelectric ultrasonic transducers. 2016 IEEE International Ultrasonics Symposium (IUS) Tours (pp. 1-4) (2016).

(Continued)

*Primary Examiner* — Nguyen Q. Ha
(74) *Attorney, Agent, or Firm* — Morgan, Lewis & Bockius LLP

(57) ABSTRACT

An ultrasound device for use with various types of imaging. In some embodiments, the ultrasound device may comprise a circuitry substrate and a plurality of transducer chips coupled to the circuitry substrate. In some embodiments, each transducer chip may comprise a microelectromechanical systems (MEMS) component that may include a plurality of ultrasound elements closely packed with one another, an Application-Specific Integrated Circuit (ASIC) that may be operatively coupled to the plurality of ultrasound elements of said MEMS component, and a control unit that may be electrically coupled to each ASIC of the plurality of transducer chips for control thereof. In some embodiments, at least two transducer chips of the plurality of transducer chips may be placed on the circuitry substrate with a separation distance that may be less than an operational wavelength of the ultrasound elements of the MEMS components of said at least two transducer chips.

36 Claims, 12 Drawing Sheets

(51) Int. Cl.
*G01S 7/52* (2006.01)
*G01S 15/89* (2006.01)

(58) Field of Classification Search
CPC ...... G01S 7/52079; G01S 15/00; G01S 15/89; G01S 15/8925
See application file for complete search history.

(56) References Cited

U.S. PATENT DOCUMENTS

| | | | |
|---|---|---|---|
| 5,127,410 | A | 7/1992 | King et al. |
| 5,810,733 | A | 9/1998 | Van et al. |
| 6,320,239 | B1 | 11/2001 | Eccardt et al. |
| 6,775,388 | B1 | 8/2004 | Pompei |
| 6,958,255 | B2 | 10/2005 | Khuri-Yakub et al. |
| 8,988,971 | B2 | 3/2015 | Mueller et al. |
| 10,835,209 | B2 * | 11/2020 | Haque ............... H10N 30/1051 |
| 10,856,846 | B2 * | 12/2020 | Davis ................. G01S 15/8927 |
| 2003/0028108 | A1 | 2/2003 | Miller |
| 2003/0235119 | A1 | 12/2003 | Wien et al. |
| 2006/0238067 | A1 | 10/2006 | Dausch |
| 2007/0239001 | A1 | 10/2007 | Mehi et al. |
| 2007/0299345 | A1 | 12/2007 | Adachi et al. |
| 2008/0296708 | A1 | 12/2008 | Wodnicki et al. |
| 2009/0122651 | A1 | 5/2009 | Kupnik et al. |
| 2010/0168583 | A1 | 7/2010 | Dausch et al. |
| 2012/0277639 | A1 | 11/2012 | Pollock et al. |
| 2013/0020698 | A1 | 1/2013 | Hsieh et al. |
| 2013/0026655 | A1 | 1/2013 | Lee et al. |
| 2013/0277772 | A1 | 10/2013 | Bryzek |
| 2013/0345567 | A1 | 12/2013 | Sudol et al. |
| 2014/0184027 | A1 | 7/2014 | Rice et al. |
| 2014/0187962 | A1 | 7/2014 | Reiter |
| 2015/0061465 | A1 | 3/2015 | Lee et al. |
| 2015/0087991 | A1 | 3/2015 | Chen et al. |
| 2015/0097468 | A1 | 4/2015 | Hajati et al. |
| 2015/0282783 | A1 | 10/2015 | Katsura et al. |
| 2016/0009544 | A1 | 1/2016 | Rothberg et al. |
| 2016/0187301 | A1 | 6/2016 | Gu |
| 2016/0244324 | A1 | 8/2016 | Gurin |
| 2106/0338339 | | 11/2016 | Floyd |
| 2017/0128983 | A1 | 5/2017 | Horsley et al. |
| 2018/0003678 | A1 | 1/2018 | Rothberg et al. |
| 2019/0015072 | A1 | 1/2019 | Deladi et al. |
| 2019/0178849 | A1 | 6/2019 | Abraham et al. |
| 2019/0290243 | A1 | 9/2019 | Bryzek et al. |
| 2021/0086231 | A1 | 3/2021 | Bircumshaw et al. |
| 2021/0088655 | A1 | 3/2021 | Bircumshaw et al. |
| 2021/0094070 | A1 | 4/2021 | Bircumshaw et al. |
| 2021/0153844 | A1 | 5/2021 | Fredrick et al. |

FOREIGN PATENT DOCUMENTS

| | | |
|---|---|---|
| JP | 2018029147 A | 2/2018 |
| KR | 20160018235 A | 2/2016 |
| KR | 20170030605 A | 3/2017 |
| WO | WO-2008137030 A1 | 11/2008 |
| WO | WO-2014/178163 A1 | 11/2014 |
| WO | WO-2016011000 A1 | 1/2016 |
| WO | WO-2017143307 A1 | 8/2017 |
| WO | WO-2019222116 A1 | 11/2019 |
| WO | WO-2019222118 A1 | 11/2019 |
| WO | WO-2020198257 A1 | 10/2020 |
| WO | WO-2021079160 A1 | 4/2021 |
| WO | WO-2021102127 A1 | 5/2021 |

OTHER PUBLICATIONS

PCT/US2019/032060 International Search Report and Written Opinion dated Jul. 26, 2019.
PCT/US2019/032062 International Search Report and Written Opinion dated Jul. 29, 2019.
PCT/US2020/061261 International Search Report and Written Opinion dated Feb. 9, 2021.
PCT/US2022/012126 International Search Report and Written Opinion dated Apr. 1, 2022.
PCT/US2021/056026 International Search Report and Written Opinion dated Jan. 28, 2022.
PCT/US2021/056669 International Search Report and Written Opinion dated Jan. 28, 2022.
PCT/US2022/021556 International Search Report and Written Opinion dated Jul. 22, 2022.
PCT/US2022/021556 Invitation to Pay Additional Fees dated May 26, 2022.
International Search Report and Written Opinion of Application No. PCT/US22/42500, dated Jan. 4, 2023, 10 pages.
Youngil Kim et al.: "2D capacitive micromachined ultrasound transducer using novel tiling based on silicon frame", Medical Imaging 2013: Ultrasonic Imaging, Tomography, and Therapy, vol. 8675, Mar. 29, 2013 (Mar. 29, 2013), p. 86750E1-86750E7, XP093165351.

* cited by examiner

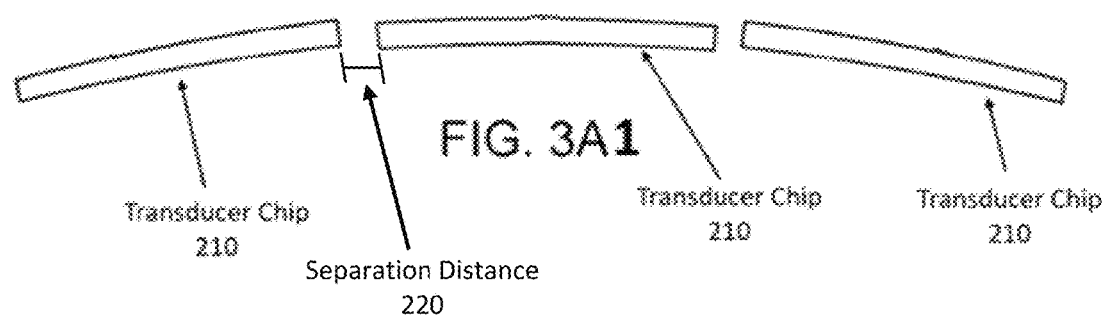
FIG. 3A1
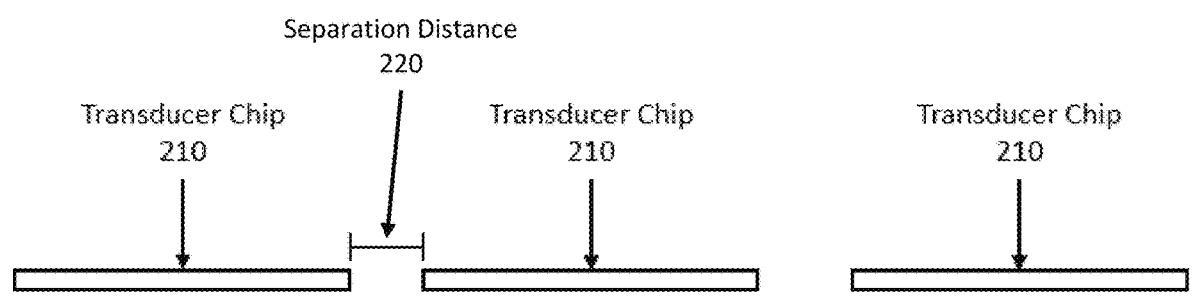
FIG. 3A2

MULTI-TRANSDUCER CHIP ULTRASOUND DEVICE

CROSS-REFERENCE

Background

The present disclosure relates to non-intrusive imaging systems and/or probes for imaging internal tissue, bones, blood flow, or organs of human or animal body or other objects of interest, such as a toy or a shipment package, and displaying the images. Such systems and/or probes typically require transmission of a signal into the body and the receiving of an emitted or reflected signal from the body part being imaged. Typically, transducers that are used in an imaging system are referred to as transceivers and some of the transceivers are based on photo-acoustic and/or ultrasonic effects. In general, the transceivers are used for imaging, but are not necessarily limited to imaging. For example, the transceivers can be used in medical imaging, flow measurements in pipes, speaker and microphone arrays, lithotripsy, localized tissue heating for therapeutics, or highly intensive focused ultrasound (HIFU) for surgery, to name a few examples.

Conventional ultrasound transducers are typically built from bulk piezoelectric (PZT) material and typically require very high voltage pulses to generate transmission signals, typically 100 V or more. This high voltage can result in high power dissipation, since the power consumption/dissipation in the transducers is proportional to the square of the drive voltage. There is often also a limit on how hot the surface of the probe could be and this limits how much power could be consumed in the probe, since the consumed power is proportional to the heat generated by the probe. In the conventional systems, the heat generation has necessitated codling arrangements for some probes, increasing the manufacturing costs and weights of the probes. In general, the weight of the conventional probe is also an issue, since a large number of sonographers, who use these probes, are known to suffer from muscular injuries.

The conventional ultrasound probes in use for medical imaging typically use PZT material or other piezo ceramic and polymer composites. Probes typically house the transducers and some other electronics with means to cause an image to be displayed on a display unit. To fabricate the conventional bulk PZT elements for the transducers, one can simply cut a thick piezoelectric material slab into large rectangular shaped PZT elements. These rectangular shaped PZT elements are very expensive to build, since the manufacturing process involves precisely cutting of the rectangular shaped thick PZT or ceramic material and mounting on substrates with precise spacing. Further, the impedance of the transducers is much higher than the impedance of the transmit/receive electronics for the transducers.

In the conventional systems, the transmit/receive electronics for the transducers often are located far away from the probe, requiring micro-coax cables between the transducers and electronics. In general, the cables need to have a precise length for delay and impedance matching, and, quite often, additional impedance matching networks are required for efficient connection of the transducers through the cables to the electronics.

Advances in micro-machining technologies allow sensors and actuators, such as capacitive micromachined ultrasound transducers (cMUTs) and piezoelectric micromachined ultrasound transducers (pMUTs), to be efficiently formed on a (silicon) substrate. Compared to the conventional transducers having bulky piezoelectric material, MUTs are less bulky and cheaper to manufacture while they have simpler and higher performance interconnection between electronics and transducers, provide greater flexibility in the operational frequency, and potential to generate higher quality images.

Although the basic concepts for these transducers have been disclosed in the early 1990's, commercial implementation of these concepts has met with a number of challenges. For instance, the conventional cMUT sensors are particularly prone to failure or drill in performance due to the charge build-up during the high voltage operation, difficulty with generating high enough acoustic pressure at lower frequencies and are inherently nonlinear. The conventional pMUTs have been a promising alternative but have issues related to transmission and receive inefficiencies, still required relatively high operating voltages and had limited bandwidth. As such, there is a need for improved MUTs that have an enhanced efficiency, that can operate at lower voltages and exhibit high bandwidth.

SUMMARY OF THE DISCLOSURE

The present disclosure provides an ultrasound device which may be comprised of multiple transducer chips interconnected into an array. The transducer chips may encompass a microelectromechanical systems (MEMS) component that is in communication with an Application-Specific Integrated Circuit (ASIC). The ASIC chip may be coupled to the many ultrasound elements of the said MEMS component and be electrically interconnected with a control chip either through a wirebond assembly or a through silicon via (TSV) packaging. In some embodiments, the transducer chips may be assembled on an array with a separation distance that may be less than operating ultrasound wavelength, which may cause an overlap of the imaging aperture, which may lead to an increase in both imaging area and lateral resolution.

In an aspect, the present disclosure provides an ultrasound device for use with various types of imaging. In some embodiments, the ultrasound device may comprise a circuitry substrate and a plurality of transducer chips coupled to the circuitry substrate. In some embodiments, the circuitry substrate may comprise a metallic substrate such as a Printed Circuit Board (PCB). In some embodiments, each transducer chip may comprise a microelectromechanical systems (MEMS) component that may include a plurality of ultrasound elements closely packed with one another, an Application-Specific Integrated Circuit (ASIC) that may be operatively coupled to the plurality of ultrasound elements of said MEMS component, and a control unit that may be electrically coupled to each ASIC of the plurality of transducer chips for control thereof. In some embodiments, at least two transducer chips of the plurality of transducer chips may be placed on the circuitry substrate with a separation distance that may be less than an operational wavelength of the ultrasound elements of the MEMS components of said at least two transducer chips.

In another aspect, an ultrasound device comprises a circuitry substrate, and a plurality of transducer chips coupled to the circuitry substrate. In some cases, each transducer chip comprises a microelectromechanical systems (MEMS) component including a plurality of ultrasound elements closely packed with one another, and an Application-Specific Integrated Circuit (ASIC) operatively coupled to the plurality of ultrasound elements of said MEMS component. In some embodiments, the ultrasound device comprises a control unit electrically coupled to each ASIC of the plurality of transducer chips for control thereof, wherein at least two transducer chips of the plurality of transducer chips are placed on the circuitry substrate with a separation distance of less than an operational wavelength of the ultrasound elements of the MEMS components of said at least two transducer chips. In some embodiments, the ultrasound device comprises the circuitry substrate comprises a standard Printed Circuit Board (PCB) or a Flexible Printed Circuit Board (Flex Board). In some embodiments, said Flex Board has a curvature that is fixed. In some embodiments, said Flex Board has a curvature that is changing to conform in real time to a target surface for imaging.

In some embodiments, the transducer chip has a specific operational wavelength. In some embodiments, the separation distance between any adjacent transducer chips is optimized for the specific operational wavelength of the adjacent transducer chips. In some embodiments, the separation distance between said at least two transducer chips is 20 µm or less. In some embodiments, the at least two transducer chips are placed on the circuitry substrate in a coplanar manner. In some embodiments, the at least two transducer chips are placed on the circuitry substrate in a curved manner. In some embodiments, a first transducer chip of the plurality has one or more operating frequencies independent from those of a second subsequent transducer chip of the plurality. In some embodiments, the separation distance between adjacent ultrasound elements within any transducer chip is optimized for the specific operational wavelength of the transducer chip. In some embodiments, the ultrasound device may comprise one or more acoustic lenses coupled to the plurality of transducer chips. In some embodiments, the one or more acoustic lenses comprises a first acoustic lens coupled to a first transducer chip and a second acoustic lens coupled to a second transducer chip, and wherein the first and second acoustic lenses have curvatures. In some embodiments, each transducer chip is coupled to the circuitry substrate by a three-dimensional interconnection mechanism. In some embodiments, the three-dimensional interconnection mechanism comprises a wirebond.

In some embodiments, the three-dimensional interconnection mechanism comprises a Through-Silicon Via (TSV) through the full thickness of the ASIC in said transducer chip. In some embodiments, the control unit has a three-dimensional interconnection mechanism that couples said control unit to the circuitry substrate. In some embodiments, the control unit is coupled to the circuitry substrate. In some embodiments, the control unit is coupled to a PCB separated from the circuitry substrate. In some embodiments, said control unit coordinate independent and synchronized operations of the plurality of transducer chips with timing control. In some embodiments, said ultrasound device assembly comprises a two-dimensional configuration using TSV. In some embodiments, a lens elevation is at most 200 µm above the MEMS surface, enabled by said TSV. In some embodiments, said TSV has an inductance level less than 10 pH. In some embodiments, said TSV is a TSV-last assembly. In some embodiments, said TSV-last assembly has a diameter of at least 35 µm. In some embodiments, said TSV-last assembly has a pad size of at least 20 µm greater than the diameter. In some embodiments, said TSV-last assembly has a pitch of at least 15 µm greater than the pad size. In some embodiments, in said TSV-last assembly has a depth ratio of at most 3:1 to the diameter. In some embodiments, said TSV is a TSV-mid assembly. In some embodiments, said TSV-mid assembly has a diameter of at least 2 µm. In some embodiments, said TSV-mid assembly has a pad size of at least 10 µm greater than the diameter. In some embodiments, said TSV-mid assembly has a pitch of at least 20 µm greater than the pad size. In some embodiments, said TSV-mid assembly has a depth ratio of at most 10:1 to the diameter. In some embodiments, one or more of the MEMS components comprises a piezoelectric micromachined ultrasound transducer (pMUT). In some embodiments, one or more of the MEMS components comprises a capacitive micromachined ultrasound transducer (cMUT). In some embodiments, the operational wavelength of the MEMS components of said at least two transducer chips is in a range from 0.1 mm to 3 mm.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the present disclosure are set forth with particularity in the appended claims. A better understanding of the features and advantages of the present disclosure will be obtained by reference to the following detailed description that sets forth illustrative embodiments, in which the principles of the present disclosure are utilized, and the accompanying drawings (also "Figure" and "FIG." herein), of which:

FIG. 3A1 shows a side view of an exemplary Transducer chip in curved arrangement according to embodiments of the present disclosure.

FIG. 3A2 shows a side view of an exemplary Transducer chip in planar arrangement according to embodiments of the present disclosure.

DETAILED DESCRIPTION

Figure 1:
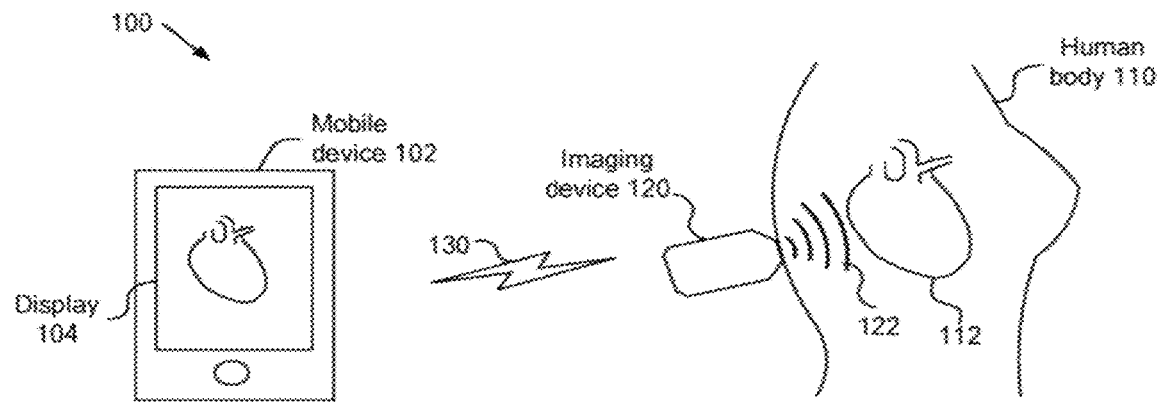
FIG. 1 shows an imaging system according to embodiments of the present disclosure.

While various embodiments of the present disclosure have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the present disclosure described herein may be employed.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

Certain inventive embodiments herein contemplate numerical ranges. When ranges are present, the ranges include the range endpoints. Additionally, every sub range and value within the range is present as if explicitly written out. The term "about" or "approximately" may mean within an acceptable error range for the particular value, which will depend in part on how the value is measured or determined, e.g., the limitations of the measurement system. For example, "about" may mean within 1 or more than 1 standard deviation, per the practice in the art. Alternatively, "about" may mean a range of up to 20%, up to 10%, up to 5%, or up to 1% of a given value. Where particular values are described in the application and claims, unless otherwise stated the term "about" meaning within an acceptable error range for the particular value may be assumed.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain fabrication steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances a the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

In embodiments, the pMUTs/cMUTs (Ultrasound Element) and transducer assemblies/packages may be used for imaging internal organs of a human/animal body as well as other therapeutic applications where ultrasonic beams are used to heat tissue for healing or focus high power ultrasonic beams for micro surgery. In embodiments, the ultrasound elements and transducer assemblies/packages may also be used for ultrasonic tomography applications.

In embodiments, the manufacturing cost of Ultrasound Elements may be reduced by applying modern semiconductor and wafer processing techniques. In embodiments, thin film piezoelectric layer may be spun on or sputtered onto semiconductor wafers and later patterned to create piezoelectric transducers that each have two or more electrodes. In embodiment, each ultrasound element may be designed to have the ability to emit or receive signals at a certain frequency range. Hereinafter, the terms piezoelectric element, ultrasound element, piezoelectric sensor, piezoelectric transducer, piezoelectric transceiver, and unit pixel are used interchangeably.

FIG. 1 shows a schematic diagram of an imaging system 100 according to embodiments of the present disclosure. As depicted, the system 100 may include: an imaging device (or shortly imager) 120 that generates and transmits pressure waves 122 toward an internal organ 112, such as the heart, lungs, or kidneys, in a transmit mode/process and receives pressure waves reflected from the internal organ; and a computing device (or, shortly device) 102 that sends and receives signals to the imager through a communication channel 130 and/or a cable 131. In embodiments, the internal organ 112 may reflect a portion of the pressure waves 122 toward the imager 120, and the imager 120 may capture the reflected pressure waves and generate electrical signals in a receive node/process. The imager 120 may communicate electrical signals to the device 102 and the device 102 may display images of the organ or target on a display/screen 104 using the electrical signals. In some embodiments, the imager 120 may encapsulate the device 102, and the imager 120 may communicate the electrical signals internally to the device 102 and the device 102 may display images of the organ or target on a display/screen 104 using electrical signals In embodiments, the imager 120 may be used to perform one dimensional imaging, also known as A-Scan, two-dimensional imaging, also known as B scan, three-dimensional imaging, also sometimes referred to as C scan, four dimensional imaging, and Doppler imaging. Also, the imager may be switched to various imaging modes under program control. In some embodiments, the imager 120 may be handheld or have another form factor, such as a sensor patch.

In embodiments, the imager 120 may be used to get an image of internal organs of an animal, too. The imager 120 may also be used to determine direction and velocity of blood flow in arteries and veins as in Doppler mode imaging and also measure tissue stiffness. In embodiments, the pressure wave 122 may be acoustic waves that can travel through the human/animal body and be reflected by the internal organs, tissue or arteries and veins.

In embodiments, the imager 120 may be a portable device and communicate signals through the communication channel, either wirelessly 130 (using a protocol, such as 802.11 protocol) with the device 102. In embodiments, the device 102 may be a mobile device, such as cell phone or iPad, or a stationary computing device that can display images to a user.

In embodiments, more than one imager may be used to develop an image of the target organ. For instance, the first imager may send the pressure waves toward the target organ while the second imager may receive the pressure waves reflected from the target organ and develop electrical charges in response to the received waves.

Figure 2:
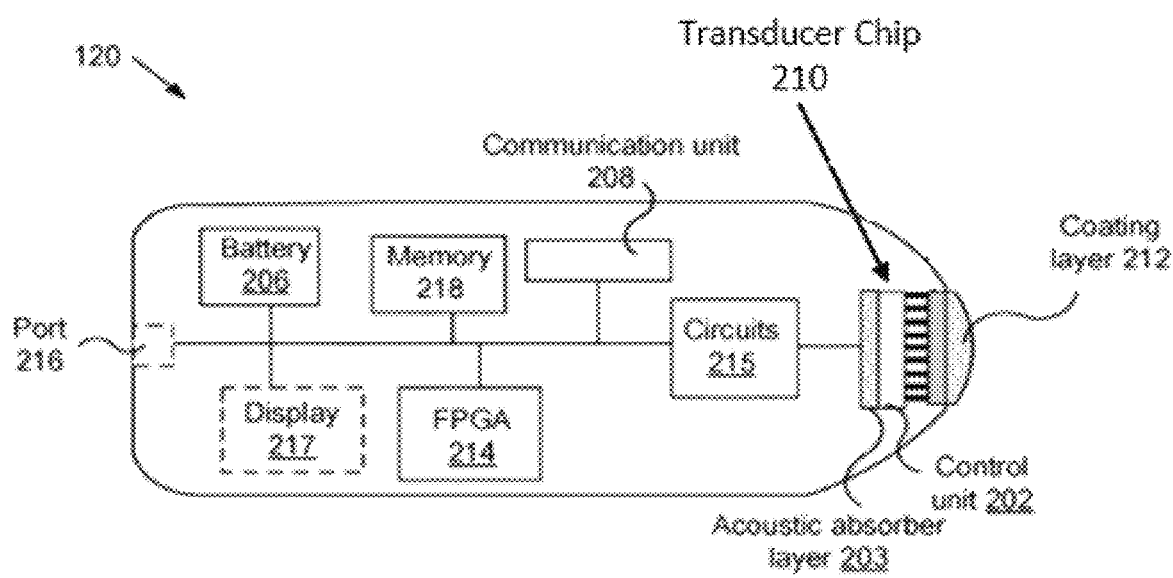
FIG. 2 shows a block diagram of an exemplary ultrasonic imager according to embodiments of the present disclosure.

FIG. 2 shows a schematic diagram of an exemplary imager 120 according to embodiments of the present disclosure. In embodiments, the imager 120 may be the same as the imager 120. It is noted that the imager 120 may have more or less than the components shown in FIG. 2.

In embodiments, the imager 120 may be an ultrasonic imager. As depicted in FIG. 2, the imager 201 may include: a Transducer chip(s) 210 for transmitting and receiving pressure waves; a coating layer 212 that operates as a lens for setting the propagation direction of and/or focusing the pressure waves and also functions as an acoustic impedance interface between the Transducer chip and the human body 110; a control unit 202, such as ASIC chip (or, shortly ASIC), for controlling the Transducer chip(s) 210 and coupled to the Transducer chip 210 by bumps; Field Programmable Gate Arrays (FPGAs) 214 for controlling the components of the imager 120; a circuit(s) 215, such as Analogue Front End (AFE), for processing/conditioning signals; an acoustic absorber layer 203 for absorbing waves that are generated by the Transducer chips 210 and propagate toward the circuit 215; a communication unit 208 for communicating data with an external device, such as the device 102, through one or more ports 216; a memory 218 for storing data; a battery 206 for providing electrical power to the components of the imager; and optionally a display 217 for displaying images of the target organs. In some embodiments, a mobile device may supply power to the imager 120.

In embodiments, the device 102 may have a display/screen. In such a case, the display may not be included in the imager 120. In embodiments, the imager 120 may receive electrical power from the device 102 through one of the ports 216. In such a case, the imager 120 may not include the battery 206. It is noted that one or more of the components of the imager 120 may be combined into one integral electrical element. Likewise, each component of the imager 120 may be implemented in one or more electrical elements.

In embodiments, the user may apply gel on the skin of the human body 110 before the body 110 makes a direct contact with the coating layer 212 so that the impedance matching at the interface between the coating layer 212 and the human body 110 may be improved, i.e., the loss of the pressure wave 122 at the interface is reduced and the loss of the reflected wave travelling toward the imager 120 is also reduced at the interface. In embodiments, the Transducer chips 210 may be mounted on a (circuitry) substrate and may be attached to an acoustic absorber layer. This layer absorbs any Ultrasonic signals that are emitted in the reverse direction, which may otherwise be reflected and interfere with the quality of the image.

As discussed below, the coating layer 212 may be only a flat matching layer just to maximize transmission of acoustic signals from the transducer to the body and vice versa. Beam focus is not required in this case, because it can be electronically implemented in control unit 202. The imager 120 may use the reflected signal to create an image of the organ 112 and results may be displayed on a screen in a variety of format, such as graphs, plots, and statistics shown with or without the images of the organ 112.

In embodiments, the control unit 202, such as ASIC, may be assembled as one unit together with the Transducer chips. In other embodiments, the control unit 202 may be located outside the imager 120 and electrically coupled to the Transducer chip 210 via a cable. In embodiments, the imager 120 may include a housing that encloses the components 202-215 and a heat dissipation mechanism for dissipating heat energy generated by the components.

FIG. 3A1 and FIG. 3A2 shows a schematic diagram of an exemplary transceiver array having three Transducer chips 210 according to embodiments of the present disclosure. The packages may be on a planar arrangement, as depicted in FIG. 3A2, or on a curved arrangement, as depicted in FIG. 3A1. The packages may be assembled with spacing that is less than the operating ultrasound wavelength, which typically ranges from 5 μm-100 μm, such as 5 μm, 20 μm, or 100 μm, between at least two Transducer chips 210. The transducer chips 210 may have a separation distance 220 measured between adjacent edges of adjacent transducer chips. A coplanar assembly may be used on a planar surface, as depicted in FIG. 3 A2, and on a curved surface a curved assembly, as depicted in FIG. 3A1, may be used for the Transducer chips 210. The coplanar assembly may require coplanarity (vertical difference in surface levels of adjacent transducer chips) that is less than the operating ultrasound wavelength, such as 15 μm. The curved assembly as depicted in FIG. 3A1, may be used for multiple possible probe structures, such as a wristband or patch.

Figure 3B:
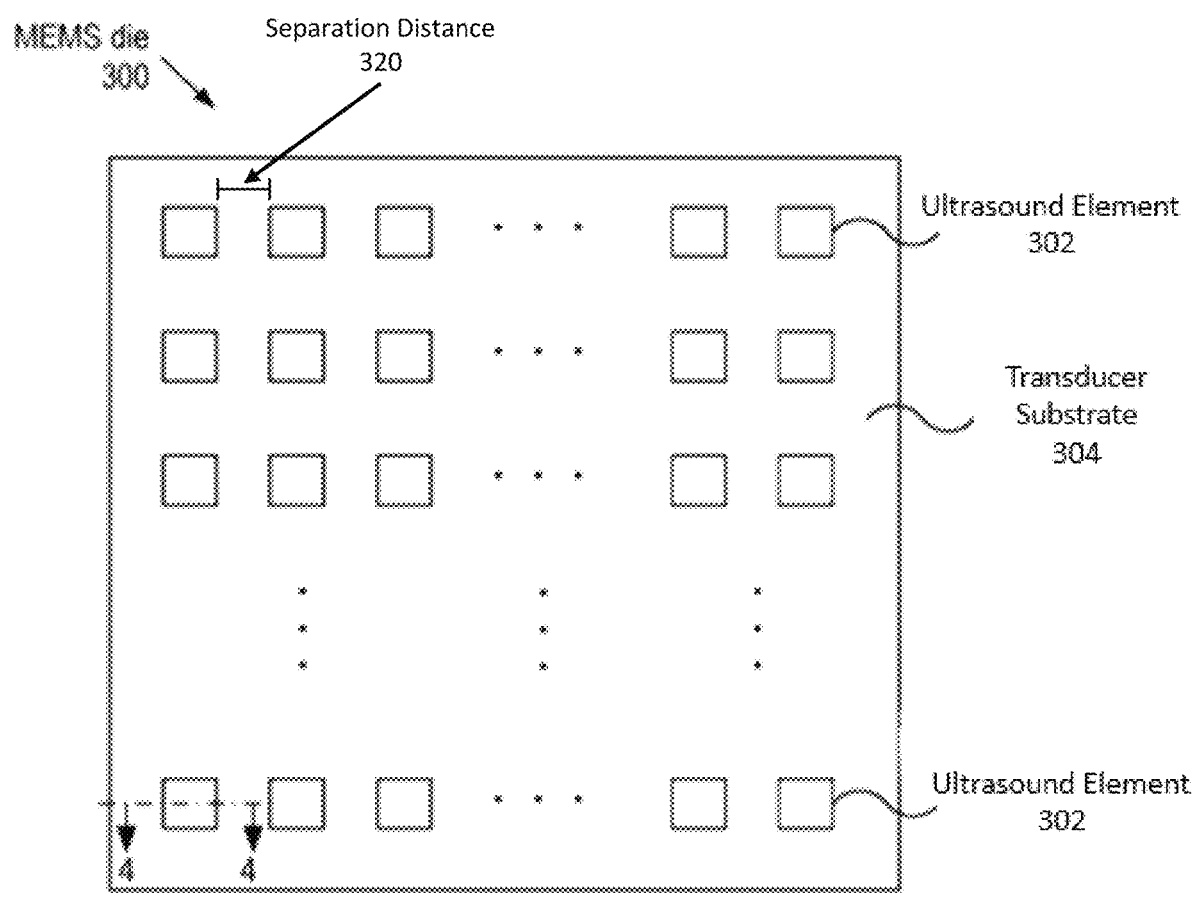
FIG. 3B shows a simplified top view of an exemplary MEMs die according to embodiments of the present disclosure.

FIG. 3B shows a top view of an individual MEMS die 300 that includes one or more ultrasound elements 302 according to embodiments of the present disclosure. As depicted, the MEMS die 300 may include a transducer substrate 304 and one or more ultrasound elements 302 arranged on the transducer substrate 304. In some embodiments the transducer substrate 304 may comprise a metallic substrate, such as silicon. In some cases, the MEMS die 300 may be assembled in such a way that the spacing between the edge column or rows on at least 2 MEMS dies 300 is equal to a multiple, such as 2, of spacing between the respective columns or rows on the other transducer chip 210. The ultrasound elements 302 may have a separation distance 320 measured between adjacent edges of adjacent ultrasound elements. In some embodiments, this MEMS die 300 structure, may simply image reconstruction.

Unlike the conventional systems that use bulk Ultrasound elements, in embodiments, the Ultrasound Element array 302 may be formed on a wafer and the wafer may be diced to form multiple Transducer Chips 210. This process may reduce the manufacturing cost since the Transducer chips 210 may be fabricated in high volume and at low cost. In embodiments, the diameter of the wafer may range 6-12 inches (150 mm-300 mm) and many Ultrasound Elements arrays may be batch manufactured. The integrated circuits for controlling the Ultrasound Element array 302 may be formed in an ASIC chip so that the Ultrasound Element array 302 may be connected to the matching integrated circuits in close proximity, preferably within 1 μm-20 μm if metal wafer boding, such as Au—Au, Al—Al or Cu—Cu, is implemented, for example, or preferably within 25 μm-100 μm if solder-based bonding is implemented, for example. For example, the Transducer chip 210 may have 1024 Ultrasound Elements 302 and be connected to a matching ASIC chip that has the appropriate number of circuits for driving the 1024 Ultrasound Elements 302.

FIG. 3B shows a top view of an exemplary MEMS die 300 included in the Transducer chip 210 according to embodiments of the present disclosure. As depicted, the MEMS die 300 may include a transducer substrate 304 and one or more Ultrasound Elements 302 arranged in one dimensional array or two dimensional array on the transducer substrate 304.

Unlike the conventional systems that use hulk ultrasound elements, in embodiments, the Ultrasound Element 302 may be formed on a wafer and the wafer may be diced to form the MEMS die 300. This process may reduce the manufacturing cost since the MEMS die 300 may be fabricated in high volume and at low cost. In embodiments, the diameter of the wafer may range 6-12 inches and many ultrasound elements arrays may be batch manufactured on each wafer. Further, in embodiments, as discussed below, the integrated circuits for controlling the Ultrasound Elements 302 may be formed in a CMOS wafer/die (such as an ASIC chip) so that the Ultrasound Elements 302 may be connected to the matching integrated circuits in close proximity, preferably within 25 μm-100 μm. In embodiments, a Bipolar Complementary Metal Oxide Semiconductor (BICMOS) or any other suitable process may be used instead of CMOS wafer/die.

In embodiments, the projection area of each ultrasound element 302 may have any suitable shape such as, square, rectangle, and circle, so on. In embodiments, two or more ultrasound elements may be connected to form a larger pixel element. In embodiments, the two dimensional are of ultrasound elements 302 may be arranged in orthogonal directions. In embodiments, to create a line element, a column of N ultrasound elements 302 may be connected electrically in parallel. Then, this line element may provide transmission and reception of ultrasonic signals similar to those achieved by a continuous ultrasound element that is about N times longer than each element.

To mimic a line element of the conventional designs, the shape of an ultrasound element of a given width may need to be very tall. For example, a line element of a conventional design may be 280 μm in width and 8000 μm tall, while the thickness may be 10-1000 μm. However, on the MEMS die 300, it is advantageous to design a line element using a plurality of identical ultrasound elements 302, where each element may have its characteristic center frequency. In embodiments, when a plurality of the ultrasound elements 302 are connected together, the composite structure (i.e. the line element) may act as one line element with a center frequency, that comprises the center frequencies of all the element pixels. In modern semiconductor processes, these center frequencies match well to each other and have a very small deviation from the center frequency of the line element. In some cases, each ultrasound element 302 may have a different center frequency.

In embodiments, the ultrasound elements 302 have one or more suspended membranes that are associated with them and vibrate at a center frequency, when exposed to stimulus at that frequency and behave like resonators. There is a selectivity associated with these resonators, known as a Q factor. In embodiments, for ultrasound imagers, Q may be usually designed to be low (close 1-3 or thereabouts) and achieved by a combination of design of the pixels and loading applied to the pixels in actual use. In embodiments, the loading may be provided by application of a layer of RTV/Polydimethylsiloxane (PDMS) or other matching material layers to the top face of the ultrasound elements, where the loading may facilitate closer impedance matching between the transducer surface emitting and receiving the pressure waves and the human body part being imaged. In embodiments, the low Q and the well matched center frequency may allow the line element to essentially act like a line imaging element with substantially one center frequency.

In embodiments, for instance, each ultrasound element 302 may be spaced 100-250 μm from each other center to center. Further to simplify, say they are square in shape. Now, let's say, to mimic a conventional line element, a column of the ultrasound elements 302 may be connected to each other. For example, 24 ultrasound elements 302 in a column may create a line element of roughly 6 mm in length, with each element being 0.25 mm in width. In embodiments, this connection may be achieved at wafer level using a metal interconnect layer, or connected in parallel using circuits in control unit 202.

For the conventional bulk ultrasound elements, the voltage potential across the top and bottom electrodes ranges 100V-200V. For the MUTs, the voltage potential across the top and bottom electrodes could be about 10 times lower to generate the same acoustic pressure. In embodiments, in order to reduce this voltage further, the ultrasound elements 302 may include a scaled down thin piezoelectric layer, and the piezoelectric layer may have a thickness in the order of 1 μm or less.

Figure 4:
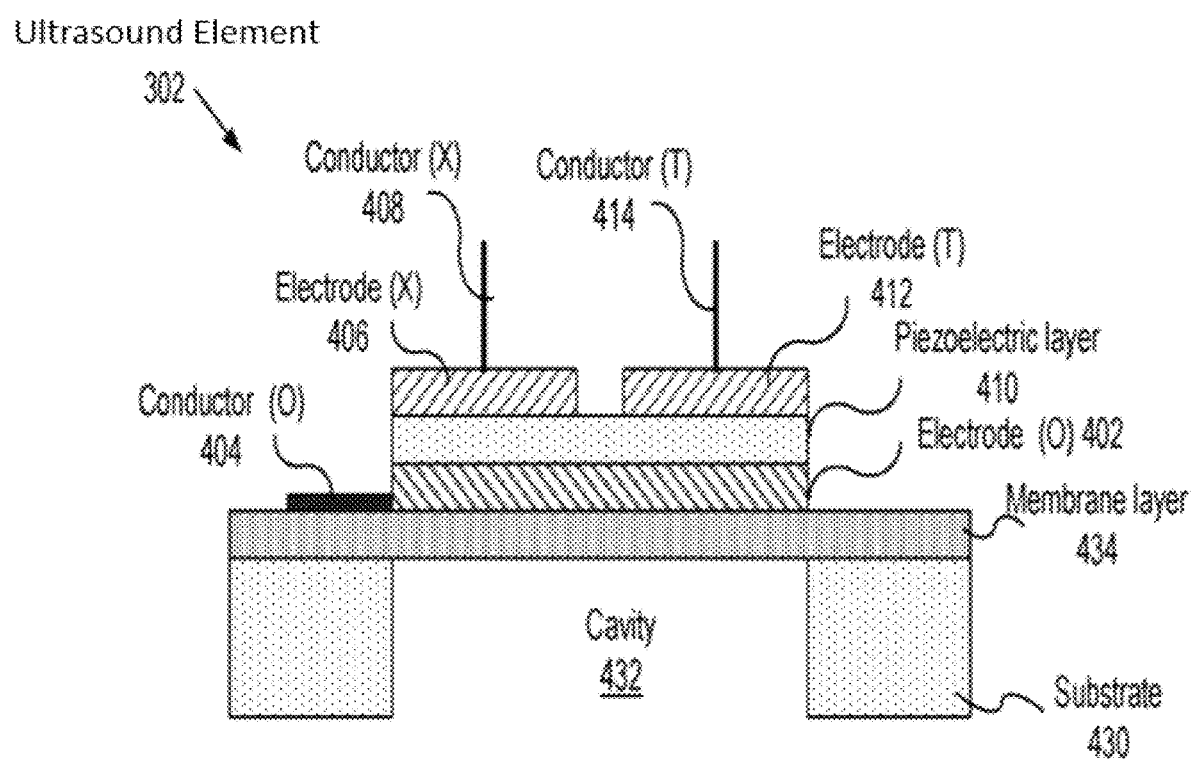
FIG. 4 shows a schematic cross sectional view of an ultrasound element according to embodiments of the present disclosure.

FIG. 4 shows a schematic cross sectional diagram of the exemplary ultrasound element 302, taken along the direction 4-4 in FIG. 3B, according to embodiments of the present disclosure. As depicted, the ultrasound element 302 may be disposed on a membrane layer 434 that is supported by a substrate 430. In embodiments, a cavity 432 may be formed in the substrate 430 to define a membrane. i.e., the substrate 430 and the membrane 434 may be formed of a monolithic body. In alternative embodiments, the membrane layer 434 may be formed by depositing SiO2 on the substrate 430. In embodiments, one or more ultrasound elements 302 may be disposed on a membrane. In alternative embodiments, each ultrasound element 302 may be disposed on a separate membrane.

In embodiments, the ultrasound element 302 may include a piezoelectric layer 410 and a first (or bottom) electrode (O) 402 that is electrically connected to a signal conductor (O) 404. In embodiments, the signal conductor (O) 404 may be formed by depositing $TiO_2$ and metal layers on the membrane layer 434. In embodiments, the piezoelectric layer 410 may be formed by the sputtering technique or by the Sol Gel process.

In embodiments, a second electrode (X) 406 may be grown above the piezoelectric layer 410 and electrically connected to a second conductor (X) 408. A third electrode (T) 412 may be also grown above the piezoelectric layer 410 and disposed adjacent to the second electrode (X) 406 but electrically isolated from the second electrode (X) 406 and electrically connected to a third conductor (T) 414. In embodiments, the second electrode (X) 406 and third electrode (T) 412 (or, equivalently, two top electrodes) may be formed by depositing one metal layer on the piezoelectric layer 410 and patterning the metal layer. In embodiments, the projection areas of the electrodes 402, 406 and 412 may have any suitable shape, such as square, rectangle, circle, and ellipse, so on.

In embodiments, the first electrode (O)) 402 may be electrically connected to the conductor (O) 404 using a metal, a via and interlayer dielectrics. In embodiments, the first electrode (O) 402 may be in direct contact with the piezoelectric layer 410. The third electrode (T) 412 may be deposited or grown on the other side of the piezoelectric layer 410 with respect to the first electrode (O) 402. More information on steps for fabricating the ultrasound element 302 may be found in the U.S. issued patent Ser. No. U.S. Pat. No. 11,058,396 B2, entitled "LOW VOLTAGE, LOW POWER MEMS TRANSDUCER WITH DIRECT INTERCONNECT CAPABILITY," filed on Nov. 29, 2017, which is herein incorporated by reference in its entirety.

While a unimorph ultrasound element is shown in FIG. 4 purely for the purpose of illustration, in embodiments, a multiplayer ultrasound element composed of a plurality of piezoelectric sublayers and electrodes can be utilized. In embodiments, the piezoelectric layer 410 may include at least one of PZT, KNN, PZT-N, PMN-Pt, AlN, Sc—AlN, ZnO, PVDF, and $LiNiO_3$ materials.

It is noted that an ultrasound element of the MEMS die 300 may include other suitable number of top electrodes. For instance, the ultrasound element may include only one top electrode (e.g. X electrode). In another example, the ultrasound element may include more than two top electrodes. More information on the number of top electrodes and electrical connections to the top electrodes may be found in the U.S. issued U.S. Pat. No. 11,058,396 B2.

It is noted that FIG. 4 is a schematic diagram and, as such, does not illustrate the detailed structure of an ultrasound element. For instance, an electrical pad may be disposed between one end of the conductor (X) 408 and the electrode (X) 406. Also, the MEMS die 300 may include ultrasound elements that have different structures from the ultrasound element 302. For instance, each ultrasound element in the MEMS die 300 may have only one top electrode. Thus, it should be apparent to those of ordinary skill in the art that the ultrasound element 302 is one of several types of ultrasound elements that can be included in the MEMS die 300.

Figure 5A:
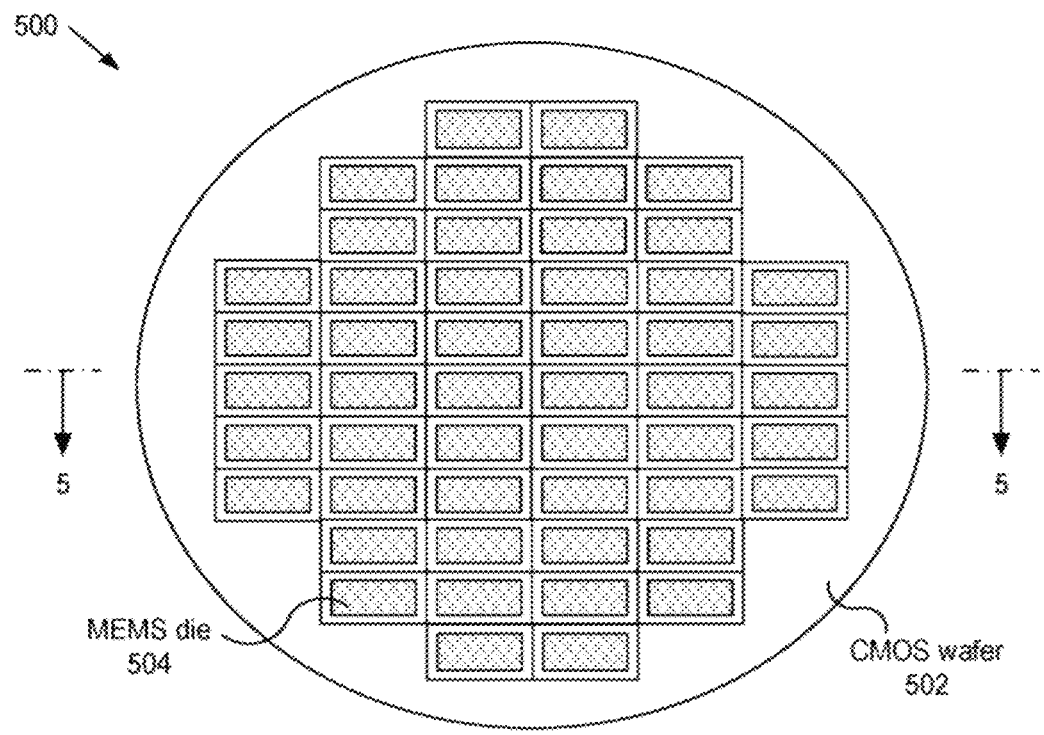
FIG. 5A shows a top view of a flip-chip assembled ultrasound element dice on a CMOS wafer according to embodiments of the present disclosure.
Figure 5B:
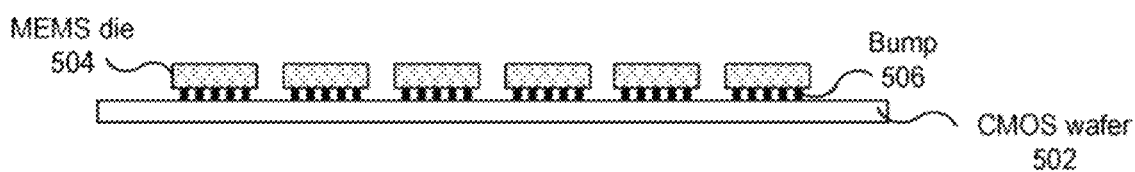
FIG. 5B shows a cross sectional view of the flip-chip assembly in FIG. 5, taken along the direction 5-5, according to embodiments of the present disclosure.

FIG. 5A shows a top view of a flip-chip assembly 500 that includes multiple MEMS dice (or a MEMS wafer) 504 mounted on a CMOS wafer 502 according to embodiments of the present disclosure. FIG. 5B shows a cross sectional view of the flip-chip assembly 500, taken along the direction 5-5, according to embodiments of the present disclosure. As depicted, the MEMS dice 504 may be mounted on the CMOS wafer 502 by metal bumps or pillars 506. In embodiments, the CMOS wafer 502 may include an ASIC for controlling the Ultrasound Elements in the MEMS dice 504. (The terms CMOS and ASIC can be used herein interchangeably.) In embodiments, the pitch between bumps or pillars 506 may range between 1-200 µm, enabling a high-density interconnects applicable to the MEMS dice 504 having a large array of Ultrasound Elements. In embodiments, the MEMS dice 504 with large number of Ultrasound Elements may be used for two, three-, and four-dimensional imaging. In some embodiments, the MEMS dice 504 may be bound to the ASIC. In some cases, the MEMS dice 504 may be bonded to the ASIC through the MEMS bumping 506. In some embodiments, the MEMS dice 504 may be fabricated onto components of the ASIC.

Figure 6:
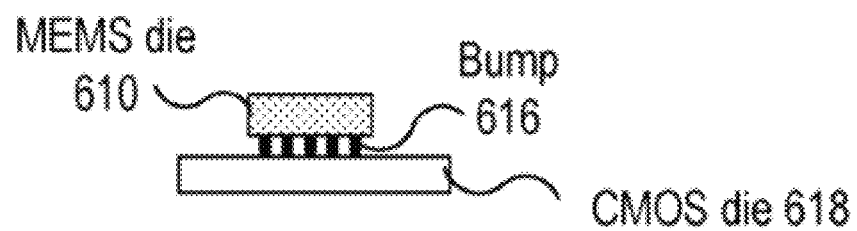
FIG. 6 shows a cross sectional view of the singulated flip-chip assembly that includes a MEMS die and a CMOS die according to embodiments of the present disclosure.

FIG. 6 shows a cross sectional view of a singulated flip-chip assembly that includes a MEMS die 610 mounted on a CMOS die 618 according to embodiments of the present disclosure. In embodiments, the MEMS die 610 may be similar to the MEMS die 504. In embodiments, a MEMS wafer having multiple MEMS dice may be fabricated and diced into single chips. Similarly, in embodiments, a CMOS wafer having multiple ASIC chips may be fabricated and diced into single chips. Then, as depicted in FIG. 6, a MEMS die 610 may be mounted on a CMOS die 618 by multiple bumps or pillars 616.

In embodiments, a single MEMS die may be mounted on the CMOS wafer. In embodiments, the flip-chip assembly may be created by die-on-die, die-on-wafer, or wafer-on-wafer bonding. In embodiments, a wafer-to-wafer bonding process may result in the yield multiplication effect, i.e., the integrated (assembled) die yield may be a product of the MMS wafer yield multiplied by CMOS wafer yield. In embodiments, a known good die-on-die bonding process or a known good die on known good wafer site bonding process may eliminate the yield multiplication effect, that may exist when the MEMS wafer is bound to the CMOS wafer.

Figure 7:
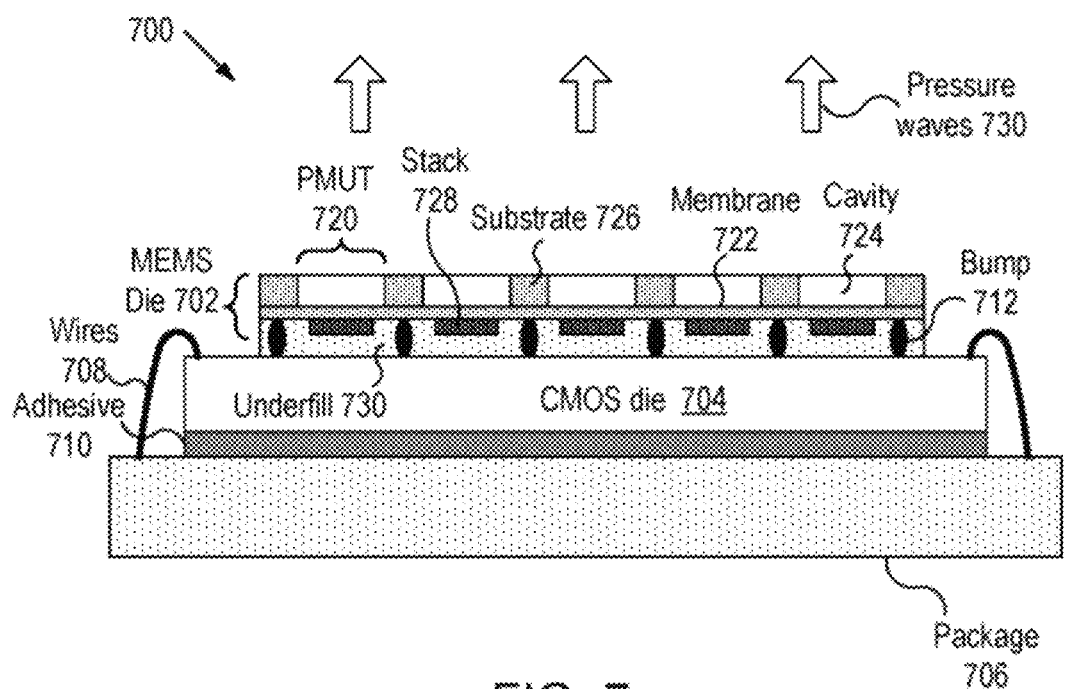
FIG. 7 shows a cross sectional view of a MEMS-CMOS assembly according to embodiments of the present disclosure.

FIG. 7 shows a cross sectional view of a MEMS-CMOS assembly 700 according to embodiments of the present disclosure. As depicted, the MEMS-CMOS assembly 700 may include: a MEMS die 702; a CMOS die 704 electrically coupled to the MEMS die by bump or pillars 712; and a package 706 secured to the CMOS die by an adhesive layer 710. In embodiments, the CMOS die 704 may be electrically coupled to the package 706 by one or more wires 708. In embodiments, the tips of each wire 708 may be coupled to the CMOS die 704 and package 706 by a wire bonding technique.

In embodiments, the MEMS die 702, which may be similar to the MEMS die 300 in FIG. 3B, may include an array of Ultrasound Elements 720, where each Ultrasound Elements may be similar to the Ultrasound Elements 302 in FIGS. 3 and 4. In embodiments, each Ultrasound Elements 720 may include a membrane 722 formed on a substrate 726 and a stack of layers 728 that include a bottom electrode, a piezoelectric layer, and one or more top electrodes. In embodiments, the membrane 722 may be formed by etching a cavity in the substrate 726, i.e., a monolithic body may be etched to form a cavity so that the non-etched portion becomes the substrate and the etched portion defines the membrane. In alternative embodiments, the membrane 722 may be formed of different material than the substrate 726. In embodiments, the MEMS die 702 may include one or more membranes 722.

In embodiments, portions of the MEMS die 702 may be directly attached to the bumps 712 to provide electrical connection to CMOS die 704. In embodiments, at least one metal layer may be deposited on the bottom surface of the MEMS die and patterned to thereby form electrical connections (such as wires and/or traces), where some of the electrical connections may be in direct contact with the bumps 712 for electrical communication with the CMOS die 704. For instance, a conductor, which may be similar to the conductor (O) 404, may be an electrical wire (or trace) formed by depositing and patterning a metal layer on the bottom surface of the MEMS die 702.

If the MEMS-CMOS assembly 700 inadvertently falls on a hard surface, the impact may generate a shock in the order of 10,000 g, which may shear the bumps or pillars 712. In embodiments, the space between the MEMS die 702 and CMOS die 704 may be filled with underfill material 730 that may reduce the external stress impact and protect the components, such as bumps 712, that are sensitive to impact stress. Also, the underfill material (layer) 730 may mechanically secure the MEMS die 702 to the CMOS die 704. In embodiments, the underfill material 730 may additionally have acoustic damping properties to absorb the pressure wave that passes through the underfill material 730.

In embodiments, the Ultrasound Elements 720 may be electrically coupled to the bumps or pillars 712 by suitable electrical conductors (such as 404, 408 and 414). In embodiments, the electrical connections may include metal traces (and vias) formed on the bottom surface of the membrane 722 and on the stack of layers 728.

In embodiments, the CMOS die 704 may include electrical circuits for sensing and driving the Ultrasound Elements 720 so that the Ultrasound Elements may generate pressure waves during the transmit mode/process and develop electrical charge during the receive mode/process. During the transmit mode, the driving circuit in the CMOS die 704 may send electrical pulses to the Ultrasound Elements 720 via the bumps 712 and, in response to the pulses, the Ultrasound Elements may vibrate the membrane 722 in the vertical direction to generate pressure waves 730. During the receive mode, the pressure waves reflected from the target organ may deform the membrane 722, which in turn develop electrical charges in the Ultrasound Elements 720. The electrical charges may be sent to the electrical circuits in the CMOS die 704 via the bumps 712 for further processing.

During the transmit mode, a portion of the pressure waves generated by the membrane 722 may propagate toward the CMOS die 704. Since these pressure waves may be reflected from the CMOS die 704 and/or package 706 to interfere with the pressure waves reflected from the target organ, these pressure waves may negatively affect the image quality. In embodiments, the adhesive material 730 may be formed of acoustic damping material that may absorb the undesirable pressure waves and dissipate into heat energy.

In embodiments, the package 706 may connect electrical signals to/from the CMOS die 704 by one or more wires 708. In embodiments, the ASIC site of the CMOS die 704 may be somewhat larger than MEMS die 704 to enable wire bonding between the ASIC site and package 706.

As discussed above, the pressure waves propagating toward the package 706 may be undesirable since they may be reflected from the package 706 and interfere with the pressure waves reflected from the target organ. In embodiments, the adhesive layer 710 may be formed of acoustic damping material so that the pressure waves passing through the adhesive layer 710 may be absorbed and dissipated into heat energy.

Figure 8:
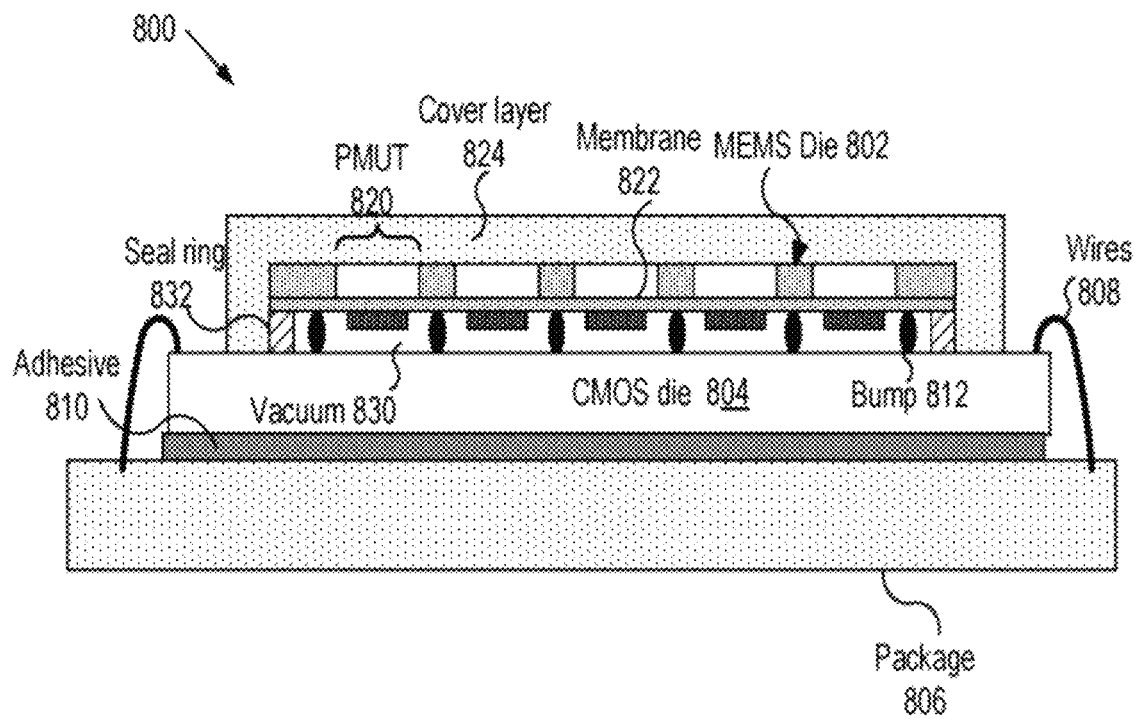
FIG. 8 shows a cross sectional view of a MEMS-CMOS assembly according to embodiments of the present disclosure.

FIG. 8 shows a cross sectional view of a MEMS-CMOS assembly 800 according to embodiments of the present disclosure. As depicted, the MEMS-CMOS assembly 800 may include: a MEMS die 802; a CMOS die 804 electrically coupled to the MEMS die by bump or pillars 812; a package 806 secured to the CMOS die 804 by an adhesive layer 810; and one or more wires 808 that may electrically couple the package 806 to the CMOS die 804. In embodiments, the MEMS die 802, CMOS die 804, and the package 806 may be similar structures and functions as their counterparts in the MEMS-CMOS assembly 700.

As discussed in conjunction with FIG. 7, the membrane 822 may generate pressure waves during the transmit mode, and a portion of the pressure wave may propagate toward the CMOS die 804. To reduce (or remove) the intensity of this undesirable pressure waves, the MEMS-CMOS assembly 800 may include a seal ring 832 that may be disposed around the perimeter of the MEMS die 802, and the space 830 enclosed by the seal ring may be kept in vacuum or in very low pressure, reducing/blocking propagation of the pressure waves through the space. For instance, the space 830 may be filled with inert gas or air at a preset pressure, preferably lower than the atmospheric pressure.

In embodiments, a cover layer 824 may be disposed around a side of the MEMS die 802 that faces the human body. The cover layer 824 may function as an impedance matching layer between the MEMS die 802 and the human body to enhance the acoustic impedance matching at the interface and also as a protection mechanism provides protection against external impact/shock, and prevents the MEMS die from directly touching the human skin to thereby provide protection against wear and tear.

Figure 9:
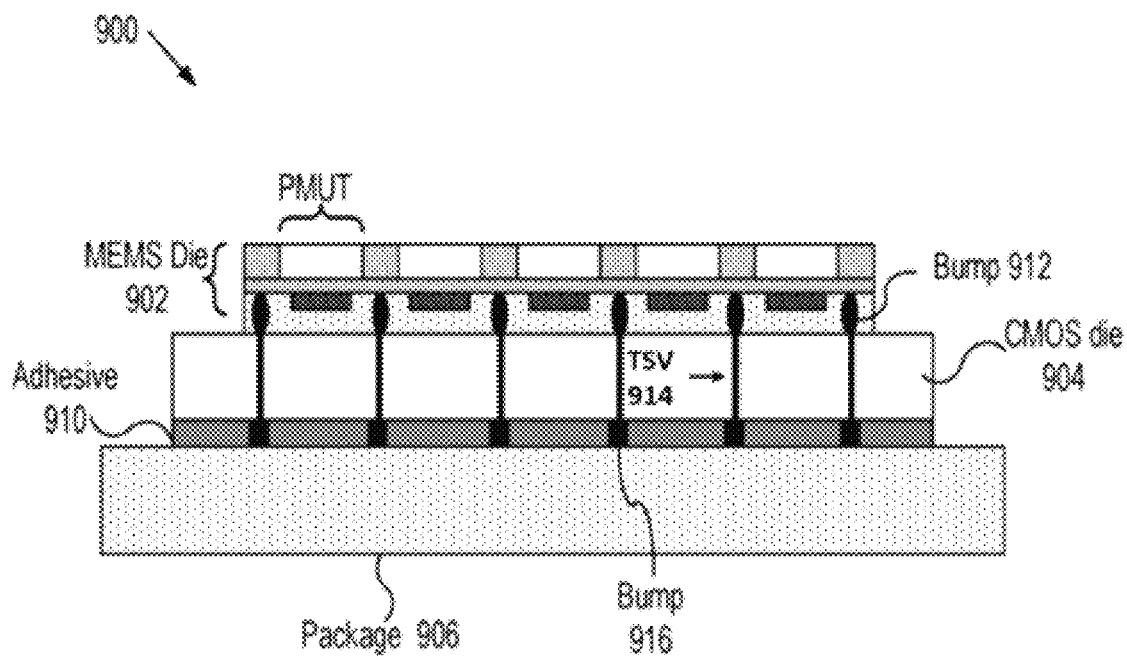
FIG. 9 shows a cross sectional view of a MEMS-CMOS assembly according to embodiments of the present disclosure.

FIG. 9 shows a cross sectional view of a MEMS-CMOS assembly 900 according to embodiments of the present disclosure. As depicted, the MEMS-CMOS assembly 900 is similar to the MEMS assembly 700, with the difference that the CMOS die 904 may be electrically coupled to the package 906 by Through-Silicon Via (TSV) 914 and bumps or pillars or pads 916. In embodiments, the TSV 914 may be formed in the CMOS die 904 by suitable wafer processing techniques, such as etching through holes and depositing/filling the holes with electrically conducting material. Ire embodiments, the TSV 914 may be either a TSV-last or a TSV-mid structure. The TSV-last or TSV-mid structure may have an ASIC with the TSV 914 under the bumps or pillars or pads 916. The TSV-last structure may have a diameter of at least 35 μm and a pad size of at least the TSV last diameter plus 20 μm. The TSV-mid structure may have a diameter of at least 2 μm, and a pad size of at least the TSV-mid diameter in addition to 10 μm. In embodiments, the TSV pitch and depth may depend on which TSV structure used, such as TSV-mid or TSV-last. A 2-dimensional configuration of multiple MEMS-CMOS assembly 900 may be enabled by TSV 914. In embodiments, the additional bumps or pillars or pads 916 may be formed on the CMOS die 904 or package 906, providing electrical connection between CMOS die 904 and package 906. In embodiments, the package 906 may communicate electrical signals to the CMOS 904 through the TSV 914 and bumps or pillars or pads 916. It is noted that the adhesive layer 910 may be formed of acoustic damping material so that the pressure waves may be absorbed and dissipated into heat energy. In some embodiments, the MEMS-CMOS assembly 900 may also have the TSV 914 connect to an electrode on one side of the CMOS die 904 to the opposite side, connecting to the ASIC.

It is noted that a cover layer, which is similar to the cover layer 824, may be disposed around the MEMS die 902, as shown in FIG. 8. Also, it is noted that the MEMS assembly 900 may include a seal ring, which is similar to the seal ring 832, so that the space enclosed by the seal ring may be kept in vacuum to prevent the pressure waves from propagating toward the CMOS die 904. Also, in embodiments, the space between the MEMS die 902 and the CMOS 904 die may be filed with an underfill material that is similar to the material 730.

Figure 10:
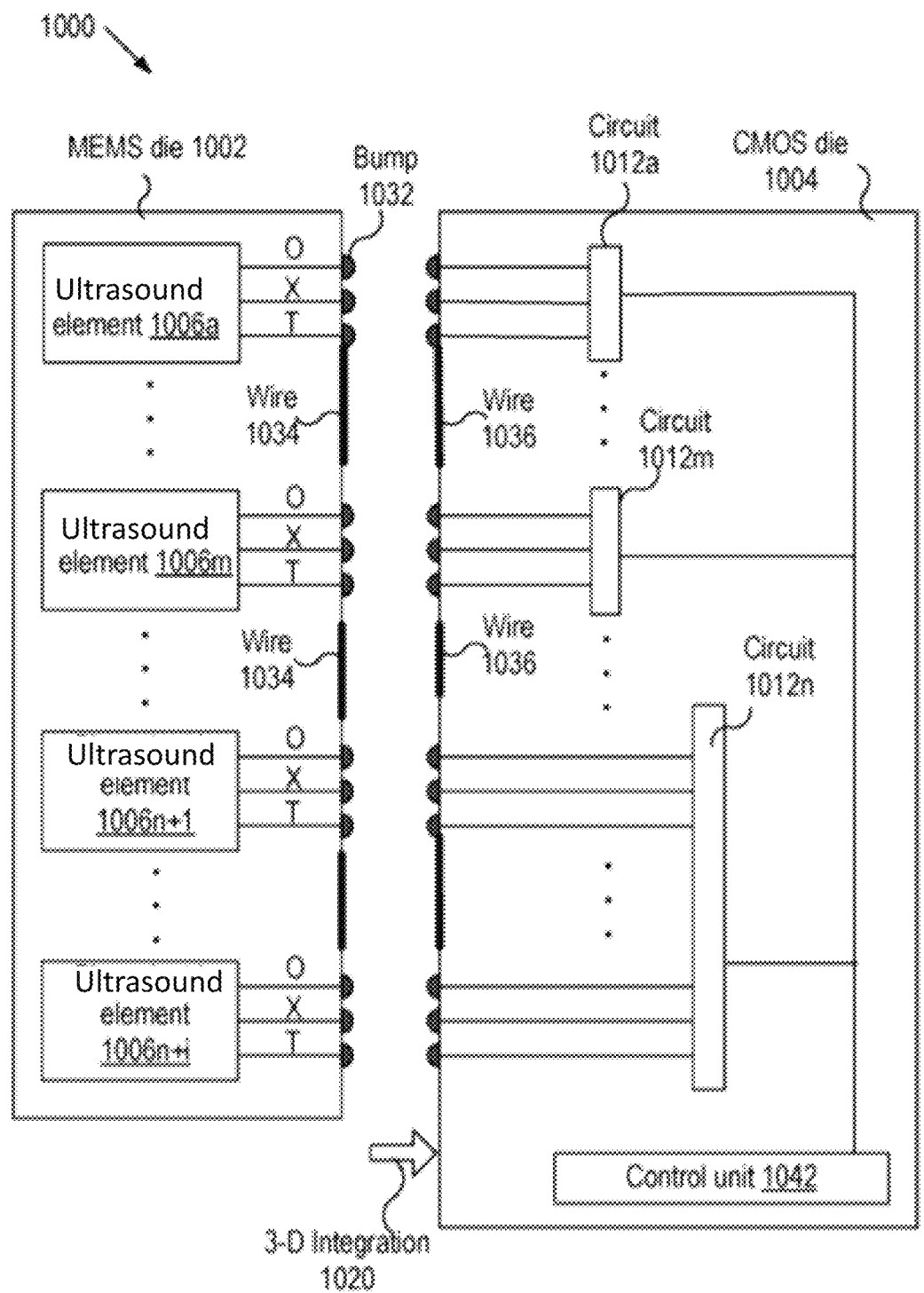
FIG. 10 shows an exemplary schematic diagram of a MEMS-CMOS assembly according to embodiments of the present disclosure.

FIG. 10 shows an exemplary schematic diagram of a MEMS-CMOS assembly (or shortly assembly) 1000 according to embodiments of the present disclosure. In embodiments, the MEMS die 1002 and CMOS die (or ASIC chip) 1004 may be similar to the MEMS die 702 (802 and 902) and CMOS die 704 (804 and 904), respectively. In the conventional systems, the electronics for driving piezoelectric transducers is typically located far away from the piezoelectric transducers and are connected to the piezoelectric transducers using a coax cable. In general, the coax cable increases parasitic loading, such as additional capacitance, on the electronics, and the additional capacitance causes more heat and loss of electrical power. In contrast, as depicted in FIG. 10, the transmit driver or drivers (or equivalently circuits) 1012a-1012n (or collectively 1012) may be connected directly to ultrasound elements (or equivalently pixels) 1006a-1006n+i (or collectively 1006) using a low impedance three dimensional (3D) interconnect mechanism (as indicated by an arrow 1020), such as Cu pillars or solder bumps 1032 (which may be similar to the bumps 712, 812, or 912), or wafer bonding or similar approaches. In embodiments, upon integrating the MEMS die 1002 to the CMOS die 1004, the circuits 1012 may be located less than 100 μm vertically (or so) away from the ultrasound elements 1006. In embodiments, any conventional device for impedance matching between driver circuits 1012 and ultrasound elements 1006 may not be required, further simplifying design and increasing power efficiency of the assembly 1000. Impedance of the circuits 1012 may be designed to match the requirement of the ultrasound elements 1006.

It is noted that each ultrasound element may be coupled to a corresponding driving circuit by more than three bumps if the ultrasound element has more than two top electrodes. Furthermore, as discussed below, each ultrasound element may be coupled to a corresponding driving circuit by less than three bumps. Thus, it should be apparent to those of ordinary skill in the art that FIG. 10 shows an exemplary connection mechanism between a MEMS die and a CMOS die.

In embodiments, each of the ultrasound elements 1006 may have three leads represented by X, T, and O. The leads from each of the ultrasound elements may be electrically connected to a corresponding one of the circuits 1012 located in the CMOS die 1004 by the bumps 1032. In embodiments, a line of ultrasound elements, such as 1006n+1-1006n+i may be electrically coupled to one common circuit 1012n. In embodiments, the transmit driver circuit 1012n may include one transmit driver that generates transmit signals to the ultrasound elements during the transmit mode. In alternative embodiment, connecting traces on MEMS or ASIC may be fabricate using thick metal, e.g., 10 μm, instead of typical metallization on the order of 1 μm.

It should be apparent to those of ordinary skill in the art that the CMOS die 1004 may have any suitable number of circuits that are similar to the circuit 1012n. In embodiments, the control unit 1042 may have capability to configure the ultrasound elements, either horizontally or vertically in a two dimensional pixel array, configure their length and put them into transmit or receive or poling mode or idle mode. In embodiments, a control unit 1042 may perform the poling process after the MEMS die 1002 is combined with the CMOS die 1004 by the bumps 1032. In embodiments, the control unit 1042 may perform coordinated or independent operation with timing control after the MEMS die 1002 is combined with the CMOS die 1004 by the bumps 1032. More information on the assembly 1000 may be found in the U.S. issued patent Ser No. 10,835,209 B2, entitled "CONFIGURABLE ULTRASONIC IMAGER," filed on Nov. 29, 2017, which is herein incorporated by reference in its entirety.

In embodiments, at least one metal layer may be deposited on a surface of the MEMS die 1002 and patterned to thereby form electrical wires (or traces) 1034, Where some of the electrical wires may be in direct contact with the bumps 1032 for electrical communication with the CMOS die 1004. The electrical wires 1034 may be also used to communicate signals between the Ultrasound elements 1006. In embodiments, at least one metal layer may be deposited on a surface of the CMOS die 1004 and patterned to thereby form electrical wires (or traces) 1036, where some of the electrical wires may be in direct contact with the bumps 1032 for electrical communication with the MEMS die 1002. The electrical wires 1036 may be also used to communicate signals between the electrical components in the CMOS die 1004. In embodiments, multiple metal layers and vias may be deposited and patterned on the MEMS die and/or CMOS die to form multiple layers of electrical wires (traces).

As discussed in conjunction with FIGS. 7-9, in embodiments, the MEMS die 1002 and CMOS die 1004 may be manufactured separately and combined to each other by a 2D interconnect technology, such as metal interconnect technology using bumps 1032. In embodiments, the interconnect technology may eliminate the low yield multiplication effect of wafer to wafer integration, lowering the yield of components. In embodiments, the MEMS die in FIG. 10 may have similar structures and functions as the MEMS die in FIGS. 7-9, and the CMOS die in FIG. 10 may have similar structures and functions as the MEMS die in FIGS. 7-9.

Figure 11:
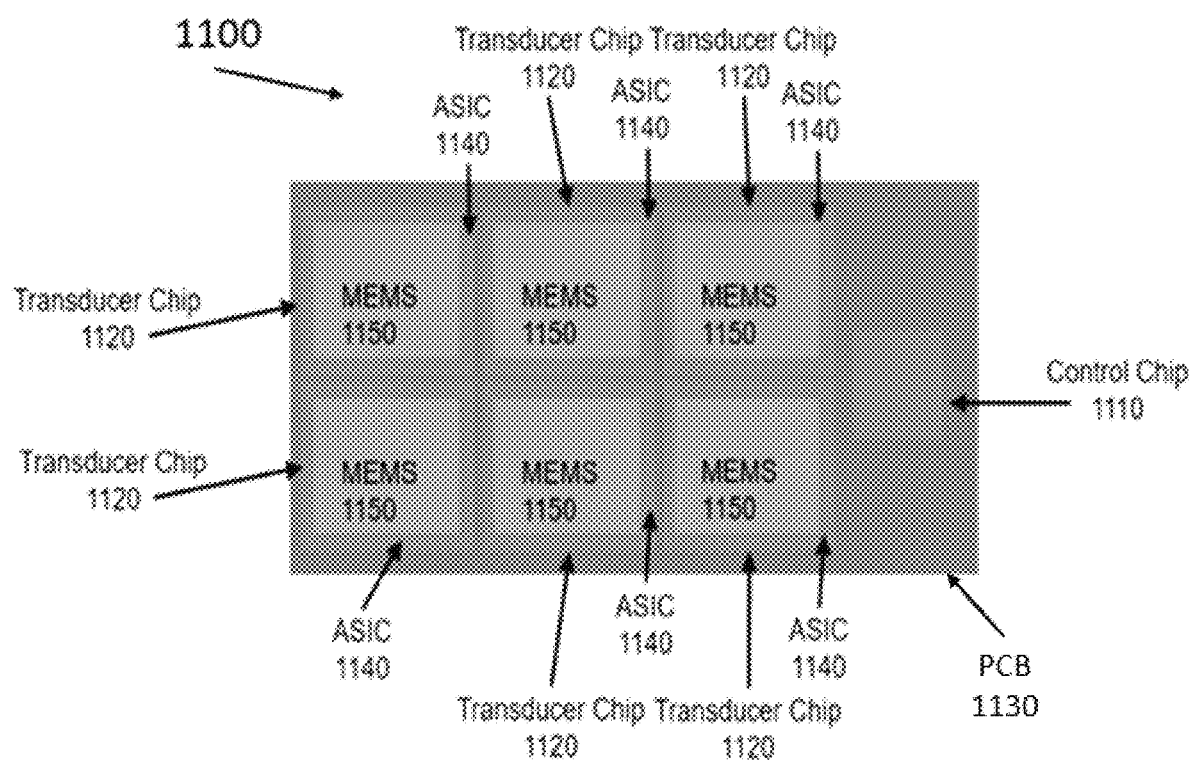
FIG. 11 shows a top view of a Transducer Chip array assembly using TSV according to embodiments of the present disclosure.

FIG. 11 shows a top view of a Transducer Chip array assembly using TSV 1100 according to embodiments of the present disclosure. In embodiments, the MEMS die 1150 and ASIC chip (or CMOS die) 1140 may be similar to the MEMS die 702 (802 and 902) and CMOS die 704 (804 and 904), respectively. In embodiments, the Transducer Chip assembly 1100 may be coordinated by a Control Chip 1110. The Control Chip 1110 may be used to control the multiple Transducer Chips 1120 for coordinated or independent operation with timing control (e.g. synchronization). In embodiments, the Transducer Chip 1120 may be comprised of a MEMS die 1150 and an ASIC chip 1140 and may be interconnected with a PCB 1130. In some embodiments, the PCB 1130 may be a rigid circuit board. In some cases the PCB 1130 may be a flexible circuit board, enabling a curved imaging area. In embodiments, the Control Chip 1110 may be interconnected to the frontside or the backside of the PCB 1130.

Figure 12:
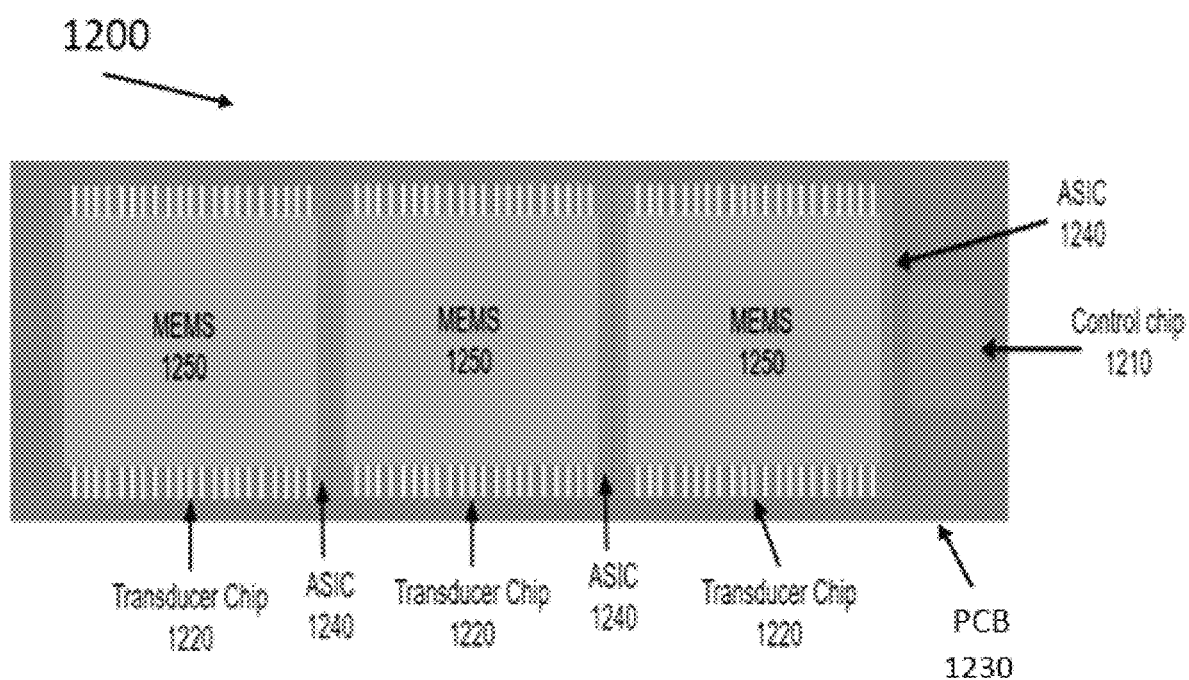
FIG. 12 shows a top view of a Transducer Chip array assembly wirebond according to embodiments of the present disclosure.

FIG. 12 shows a top view of a Transducer Chip array assembly wirebound 1200 according to embodiments of the present disclosure. In embodiments, the MEMS die 1250 and ASIC chip (or CMOS die) 1240 may be similar to the MEMS die 702 (802 and 902) and CMOS die 704 (804 and 904), respectively. In embodiments, the Transducer Chip assembly 1200 may be coordinated by a Control Chip 1210. The Control Chip 1210 may be used to control the multiple Transducer Chips 1220 for coordinated or independent operation with timing control (e.g. synchronization). In embodiments, the Transducer Chip 1220 may be comprised of a MEMS die 1250 and an ASIC chip 1240 and may be interconnected with the PCB 1230. In embodiments, the Control Chip 1210 may be interconnected through wires to the frontside or the backside of the PCB 1230.

In embodiments, using TSV to interconnect the Transducer Chip array assembly 1100 may allow for multiple Transducer Chips 1110 to be assembled next to each other seamlessly in any 2-dimensional array. In embodiments, this seamless connection may significantly increase and improve dimensionality, as compared to the embodiment described in FIG. 12. The embodiment as described in FIG. 12 may only be able to form a seamless assembly of transducer chips in one direction, whereas the embodiment as described in FIG. 11 may be able to form seamless assembly of transducer chips in multiple directions. The individual Transducer Chip arrays may be quality controlled before assembling the array, while the embodiment in FIG. 12, may require the array to be assembled before quality can be assessed.

In embodiments, using TSV to interconnect the Transducer Chip array assembly 1100 may allow for thinner lens elevation, especially around the edge of the lens, as compared to the embodiment as described in FIG. 12 (where wirebond loop height and its clearance from lens surface may set a minimum of lens elevation), which may lead to a lower attenuation and a more continuous wavelength (CW) that may be required for several forms of imaging. In embodiments, using TSV to interconnect the Transducer Chip array assembly 1100 may allow for higher operating frequencies, as compared to the embodiment as described in FIG. 12, because the use of TSV instead of a wirebound assembly may lead to lower inductance, and consequently increased operational efficiency. In embodiments, using TSV to interconnect the Transducer Chip array assembly 1100 may allow greater operation uses, by decreasing the amount of spacing required within a transducer chip array as compared to the embodiment as described in FIG. 12. The decrease in spacing may allow for imaging apertures to overlap, increasing the total imaging area of a single frame coherent image and increasing lateral resolution (lateral resolution is inversely proportional to active aperture size). In some embodiments, the increase in imaging area and lateral resolution, may allow the imaging system to be formed as a cylinder-shaped probe or a large patch with a curved ultrasound imaging area. In some embodiments, the large patch with a curved ultrasound imaging area may allow the transducer chip array to have either a fixed or changing curvature to conform to the imaged surface in real time.

In some embodiments, the ultrasound device may have the control unit coupled to a separated PCB. In some cases, the separated PCB may apart from the circuitry substrate. In some embodiments the separated PCB can house the control chip alone, or may also house multiple control chips, separated from the PCB housing the multiple transducer chips.

Figure 13:
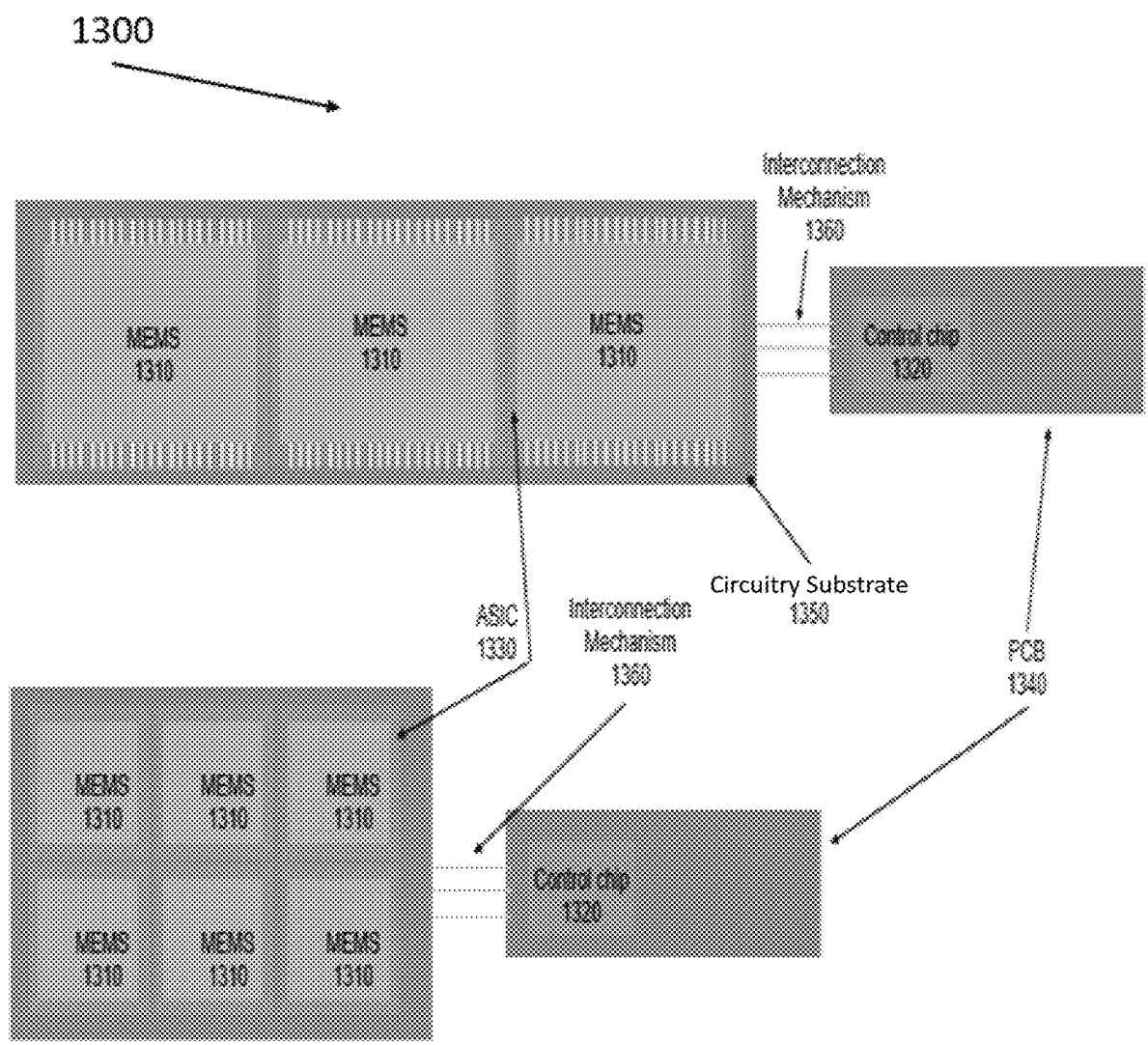
FIG. 13 shows a top view of a Transducer Chip array assembly with a control chip on a separated Printed Circuit Board (PCB), according to embodiments of the present disclosure.

FIG. 13 shows a top view of a Transducer Chip array assembly 1300 with a control chip on a separated Printed Circuit Board (PCB) 1340, according to embodiments of the present disclosure. In some embodiments, the control chip 1320 may be coupled to the separated PCB 1340. In some embodiments, The MEMs 1310 and the ASIC 1330 may be coupled to a separate Circuitry Substrate 1350. The Circuity Substrate 1350 may comprise a metallic substrate, such as a Printed Circuit Board (PCB). In some cases, the Separated PCB 1340 and the control chip 1320 may be connected to the MEMS 1310, the ASIC 1330, and the Circuitry Substrate 1350, via an interconnection Mechanism 1360. In some embodiments, the separated PCB 1340 may be a rigid structure. In some cases, the separated PCB 1340 may be a flexible structure. In some embodiments, the Circuitry Substrate 1350 may be a rigid structure. In some cases, the Circuitry Substrate 1350 may be a flexible structure. In some embodiments the Interconnection Mechanism 1360 may comprise a cable, wire, or an electrical communicable material.

In some embodiments, the transducer chip may have a specific operational wavelength. In some cases, the separation distance between adjacent transducer chips may be a different value from one another. This separation distance value may be optimized for the specific operational wavelength of the adjacent transducer chips around the separation distance. In some embodiments, at low frequencies, such as less than 2 MHz, the operational wavelength may be relatively large, such as greater than 3 mm.

In some embodiments, the separation distance between the adjacent transducer chips and the spacing between the adjacent ultrasound elements within one transducer chip may be much larger than when at high frequency. In some cases, this may make the assembly of transducer chip array and the ultrasound elements much easier to manufacture.

Figure 14:
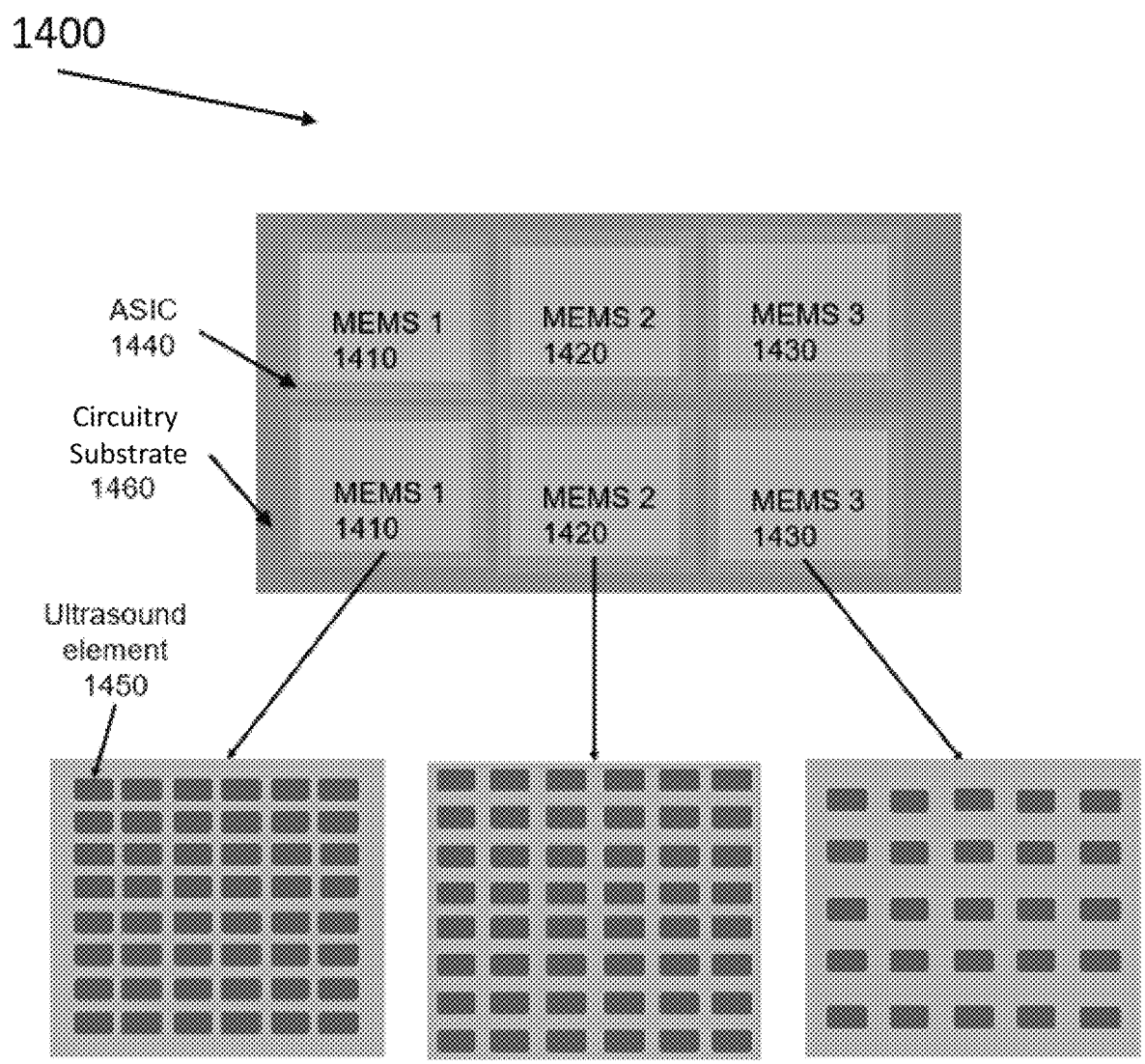
FIG. 14 shows a top view of a Transducer Chip array assembly with variable spacing between adjacent ultrasound elements, according to embodiments of the present disclosure.

FIG. 14 shows a top view of a Transducer Chip array assembly 1400 with variable spacing between adjacent ultrasound elements 1450, according to embodiments of the present disclosure. In some embodiments, MEMs 1 1410 may be comprised of a different spacing between adjacent ultrasound elements 1450 than either MEMs 2 1420 or MEMs 3 1430. In some cases, MEMs 1 1410 and MEMs 2 1420 may comprise of the same spacing between adjacent ultrasound elements 1450 while MEMs 3 1430 has a different spacing between the ultrasound elements 1450, In some embodiments, MEMs2 1420 and MEMs 3 1430 may comprise the same spacing between the adjacent ultrasound elements 1450, while MEMS 1 410 has a different spacing between the ultrasound elements 1450. In some embodiments, the MEMS 1 1410, MEMs 2 1420, and MEMs 3 1430 may be interconnected with the ASIC 1440 and coupled to the Circuitry Substrate 1460. The Circuity Substrate 1460 may comprise a metallic substrate, such as a Printed Circuit Board (PCB). In some cases, the Circuitry Substrate 1460 may comprise of a rigid PCB. In some embodiment, the Circuity Substrate 1460 may comprise of a flexible PCB. In some cases, the variable spacing between adjacent ultrasound elements 1450 may allow for optimization for the specific operational wavelength of the adjacent transducer chip array 1400. In some embodiments, the separation distance between the adjacent ultrasound elements 1450 may be larger at lower frequency than at higher frequency.

While preferred embodiments of the present disclosure have been shown and described herein, it will be obvious to those skilled in the art that such embodiments are provided by way of example only. Numerous variations, changes, and substitutions will now occur to those skilled in the art without departing from the scope of the present disclosure. It should be understood that various alternatives to the embodiments of the present disclosure described herein may be employed in practicing the inventions of the present disclosure. It is intended that the following claims define the scope of the invention and that methods and structures within the scope of these claims and their equivalents be covered thereby.

What is claimed is:

1. An ultrasound device comprising:
(i) a circuitry substrate;
(ii) a plurality of transducer chips coupled to the circuitry substrate, each transducer chip comprising:
a transducer substrate;
a microelectromechanical systems (MEMS) component including a plurality of ultrasound elements closely packed with one another on the transducer substrate, and
an Application-Specific Integrated Circuit (ASIC) operatively coupled to the plurality of ultrasound elements of said MEMS component;
(iii) a control unit electrically coupled to each ASIC of the plurality of transducer chips for control thereof,
wherein at least two transducer chips of the plurality of transducer chips are placed on the circuitry substrate such that a separation distance between two adjacent edges of the transducer substrates of the at least two transducer chips is less than an operational wavelength of the ultrasound elements of the MEMS components of said at least two transducer chips, wherein the operational wavelength of the ultrasound elements is in a range from 5 μm-100 μm.

2. The ultrasound device of claim 1, wherein the circuitry substrate comprises a standard Printed Circuit Board (PCB) or a Flexible Printed Circuit Board (Flex Board).

3. The ultrasound device of claim 2, wherein said Flex Board has a curvature that is fixed.

4. The ultrasound device of claim 2, wherein said Flex Board has a curvature that is changing to conform in real time to a target surface for imaging.

5. The ultrasound device of claim 1, wherein the separation distance between any adjacent edges of the substrates of adjacent transducer chips is optimized for a specific operational wavelength of the adjacent transducer chips.

6. The ultrasound device of claim 1, wherein the separation distance between the two adjacent edges of the substrates of said at least two transducer chips is 20 μm or less.

7. The ultrasound device of claim 1, wherein the at least two transducer chips are placed on the circuitry substrate in a coplanar manner.

8. The ultrasound device of claim 1, wherein the at least two transducer chips are placed on the circuitry substrate in a curved manner.

9. The ultrasound device of claim 1, wherein a first transducer chip of the plurality has one or more operating frequencies independent from those of a second subsequent transducer chip of the plurality.

10. The ultrasound device of claim 1, wherein the separation distance between adjacent edges of adjacent ultrasound elements within any transducer chip is optimized for a specific operational wavelength of the transducer chip.

11. The ultrasound device of claim 1, further comprising one or more acoustic lenses coupled to the plurality of transducer chips.

12. The ultrasound device of claim 11, wherein the one or more acoustic lenses comprises a first acoustic lens coupled to a first transducer chip and a second acoustic lens coupled to a second transducer chip, and wherein the first and second acoustic lenses have curvatures.

13. The ultrasound device of claim 1, wherein each transducer chip is coupled to the circuitry substrate by a three-dimensional interconnection mechanism.

14. The ultrasound device of claim 13, wherein the three-dimensional interconnection mechanism comprises a wirebond.

15. The ultrasound device of claim 13, wherein the three-dimensional interconnection mechanism comprises a Through-Silicon Via (TSV) through a full thickness of the ASIC in said transducer chip.

16. The ultrasound device of claim 1, wherein the control unit has a three-dimensional interconnection mechanism that couples said control unit to the circuitry substrate.

17. The ultrasound device of claim 1, wherein the control unit is coupled to the circuitry substrate.

18. The ultrasound device of claim 1, wherein the control unit is coupled to a PCB separated from the circuitry substrate.

19. The ultrasound device of claim 1, wherein said control unit coordinate independent and synchronized operations of the plurality of transducer chips with timing control.

20. The ultrasound device of claim 1, wherein said device assembly comprises a two-dimensional configuration using TSV.

21. The ultrasound device of claim 20, wherein a lens elevation is at most 200 μm above the MEMS surface, enabled by said TSV.

22. The ultrasound device of claim 20, wherein said TSV has an inductance level less than 10 pH.

23. The ultrasound device of claim 20, wherein said TSV is a TSV-last assembly.

24. The ultrasound device of claim 23, wherein said TSV-last assembly has a diameter of at least 35 μm.

25. The ultrasound device of claim 24, wherein said TSV-last assembly has a pad size of at least 20 μm greater than the diameter.

26. The ultrasound device of claim 25, wherein said TSV-last assembly has a pitch of at least 15 μm greater than the pad size.

27. The ultrasound device of claim 24, wherein said TSV-last assembly has a depth ratio of at most 3:1 to the diameter.

28. The ultrasound device of claim 20, wherein said TSV is a TSV-mid assembly.

29. The ultrasound device of claim 28, wherein said TSV-mid assembly has a diameter of at least 2 μm.

30. The ultrasound device of claim 29, wherein said TSV-mid assembly has a pad size of at least 10 μm greater than the diameter.

31. The ultrasound device of claim 30, wherein said TSV-mid assembly has a pitch of at least 20 μm greater than the pad size.

32. The ultrasound device of claim 29, wherein said TSV-mid assembly has a depth ratio of at most 10:1 to the diameter.

33. The ultrasound device of claim 1, wherein one or more of the MEMS components comprises a piezoelectric micromachined ultrasound transducer (pMUT).

34. The ultrasound device of claim 1, wherein one or more of the MEMS components comprises a capacitive micromachined ultrasound transducer (cMUT).

35. The ultrasound device of claim 1, wherein the separation distance between said at least two transducer chips is 20 μm or less.

36. The ultrasound device of claim 1, wherein the separation distances between adjacent edges of the transducer substrates of the transducer chips are different values from one another and are optimized for specific operational wavelengths of the transducer chips.

* * * * *